(12) United States Patent
Chidambarrao et al.

(10) Patent No.: US 7,831,941 B2
(45) Date of Patent: Nov. 9, 2010

(54) CA RESISTANCE VARIABILITY PREDICTION METHODOLOGY

(75) Inventors: Dureseti Chidambarrao, Weston, CT (US); Fook-Luen Heng, Yorktown Heights, NY (US); Mark A. Lavin, Katonah, NY (US); Jin-Fuw Lee, Yorktown Heights, NY (US); Rama N. Singh, Bethel, CT (US); Roger Y. Tsai, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 487 days.

(21) Appl. No.: 11/968,458

(22) Filed: Jan. 2, 2008

(65) Prior Publication Data

US 2009/0171644 A1 Jul. 2, 2009

(51) Int. Cl.
*G06F 17/50* (2006.01)
(52) U.S. Cl. .................. 716/4; 716/10; 716/19
(58) Field of Classification Search .......... 716/1, 716/4, 8, 10, 14
See application file for complete search history.

(56) References Cited

U.S. PATENT DOCUMENTS 6,502,230 B1 * 12/2002 Graef et al. ............ 716/14
2004/0210862 A1 * 10/2004 Igarashi et al. ........ 716/13
2006/0190876 A1 * 8/2006 Yamada ................. 716/5
2008/0086715 A1 * 4/2008 Zach .................... 716/19
2008/0263495 A1 * 10/2008 Yamada ................. 716/12
2008/0301624 A1 * 12/2008 Heng et al. ............ 716/21
2009/0077507 A1 * 3/2009 Hou et al. .............. 716/4

OTHER PUBLICATIONS

Liebmann et al., Lithography Manufacturability Assessor, LMA, "Reducing DFM to practice: the lithographic manufacturability assessor", Proc SPIE V6156, pp. 178-189, 2006.

* cited by examiner

*Primary Examiner*—Stacy A Whitmore
(74) *Attorney, Agent, or Firm*—Scully, Scott, Murphy & Presser, P.C.; H. Daniel Schnurmann (57) ABSTRACT

A methodology for obtaining improved prediction of CA resistance in electronic circuits and, particularly, an improved CA resistance model adapted to capture larger than anticipated "out of spec" regime. In one embodiment, a novel bucketization scheme is implemented that is codified to provide a circuit designer with considerably better design options for handling large CA variability as seen through the design manual. The tools developed for modeling the impact of CA variable resistance phenomena provide developers with a resistance model, such as conventionally known, modified with a new CA model Basis including a novel CA intrinsic resistance model, and, a novel CA layout bucketization model.

18 Claims, 7 Drawing Sheets

| 500 | 502 | 504 |
|---|---|---|
|  | NOMINAL RESISTANCE | MINIMUM/MAXIMUM RESISTANCE |
| CA | Rc | Rc1/Rc2 |

FIG. 9A
(PRIOR ART)

| 550 | 552 | 554 |
|---|---|---|
| CA IMAGE QUALITY/OVERLAY | NOMINAL RESISTANCE | MINIMUM/MAXIMUM RESISTANCE |
| GOOD/GOOD | Rca | Rc3/Rc4 |
| GOOD/BAD | Rcb | Rc3/Rc4 |
| BAD/GOOD | Rcc | Rc7/Rc8 |
| BAD/BAD | Rcd | Rc9/Rc10 |

FIG. 9B

CA RESISTANCE VARIABILITY PREDICTION METHODOLOGY

BACKGROUND OF THE INVENTION

1. Field of the Invention

The present invention relates generally to semiconductor circuit design, and circuit performance modeling, and, more particularly, to a system and method for improving the prediction of contact resistance variability in semiconductor device contact structures.

2. Description of the Prior Art

Variability is a serious issue for circuit designers given that performance based Circuit Limiting Yield (CLY) is now a major concern. The problem is that variability is rapidly increasing with ever shrinking technology nodes.

Figure 1A:
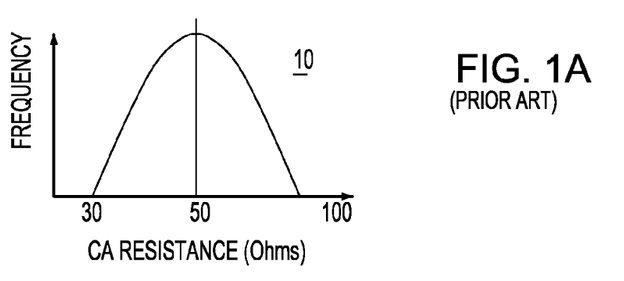
FIG. 1A shows the present CA Resistance Distribution Model in a Design "Manual" used by circuit developers for 45 nm technology CMOS devices according to the prior art; and, FIG. 1B depicts a plot that potentially provides a more accurate CA Resistance Distribution Model.

One major area of variability is the contact via (CA) resistance, a large component of which is layout proximity related. FIG. 1A shows the present CA Resistance Distribution Model used by circuit designers in 65 and 45 nm technologies. As shown in the plot 10 shown in FIG. 1A, based on input data comprising side-wall (SW) taper, CA height, and CA radius variations, it is seen that present CA variable resistance are assessed to range anywhere between 30 ohms and 100 ohms, in a bell curve distribution. The plot 15 shown in FIG. 1B should provide a more accurate CA Resistance Distribution Model for 65 and 45 nm technology designs given that there are many other parameters that cause variability which do not have Gaussian statistics. However, estimating the endpoints of the curve 18 and 19, particularly upper curve endpoint 19, is not always easy. These tails from non-Gaussian distributions at 19 represent specific mechanisms that (if treated as Gaussian) would make for very pessimistic designs.

Figure 1B:
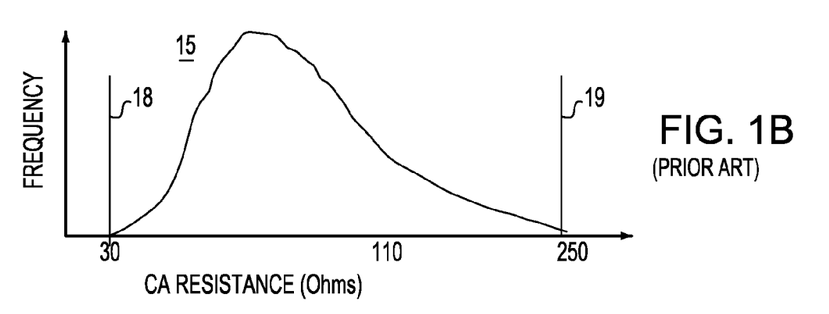

The CA variability distributions shown in FIG. 1B are largely because the CA tails from layout proximity effects are quite large (bigger than the FIG. 1A numbers that are performed for regulated designs) which impact chip functionality.

Currently, it is feasible to increase the CA Size in 65 nm technology designs. As 3-sigma tolerance shows increasing it to a 50 nm Critical Dimension (CD), for example, is possible because of excellent overlay tolerances achievable. However, in 45 nm CMOS technology designs, there is limited room to increase CA size.

Figure 2:
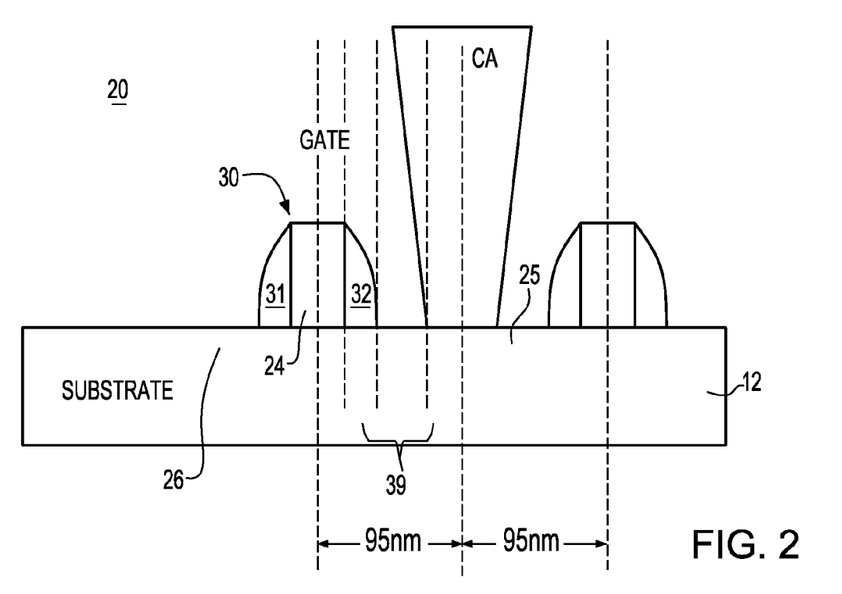
FIG. 2 depicts an example CA structure showing ground rule limitations from CMOS fabrication technology.

Particularly, FIG. 2 shows a semiconductor structure 20 including a FET device having gate structures 30, each including a gate electrode 24 having vertically formed spacer elements 31, 32, and drain and source regions 25, 26, respectively, and, further depicts a CA contact via structure 50 of tapered design, all formed on a semiconductor substrate 12. Overlay with an immersion lithography system for volume production in 45 nm is likely larger than prior 65 nm designs. Moreover, the formed spacer elements are likely to be on the order of about 20 nm in thickness from device design. Thus, as shown in FIG. 2, in an example embodiment, given a typical 95 nm distance ground-rule between the formed CA contact midline "A" and the gate vertical midline "B", there is seen not much room to accommodate the CA structure, especially in view of the example dimensions including: the gate half-length (e.g., 15-20 nm), the spacer thickness (e.g., 10-30 nm), and, the CA structure radius of about 30-40 nm. Given a CA overlay tolerance, it is possible that the CA could cut into the spacer 32 by greater than about 10 nm which may be a problem. Moreover, the ground-rules presented would require tight tolerances on the gate design itself. That is, gates must be highly constrained; even nominal gates can be tight. Moreover, there would be presented a reliability constraint for the PC-CA corner distance.

It is thus the case that CA size determines device performance and, it is the case that in some current designs, due to CA resistance variability, manufacturers are presented with major trade-off design issue between CA opens which tend to occur at the small CD, and PC-CA shorts which tend to occur at larger CD.

Thus, while the 65 nm CMOS technology need for yield is pushing the CA size to 100 nm which is currently achievable in 65 nm ground-rules, there is not enough room for this large a CA size in 45 nm CMOS technology. For example, is shown in FIG. 2, there is depicted the limited room 39 in which the CA size in 45 nm CMOS technology ground-rules can increase. On the other hand due to material issues associated with filling a small high-aspect ratio (CA) contact hole it is difficult to fill too small a CA.

It would be highly desirable to provide an improved system and method for: (a) predicting the CA resistance variation, (b) improving the design manual values, and (c) highlighting the design implications. One could then optimize designs to either move CAs around to reduce this variability or make the designs immune to CA resistance variation.

That is, the calculated resistance from simple area calculations (RSS of SW taper, CA height, bottom CD, and resistivity) as modeled in prior art are inadequate. It is understood that in these designs, overlay assumptions are built in as CD variation. Moreover, according to the modeling techniques of prior art systems, it is assumed that all CAs in the circuit being modeled have same resistance and distributions.

Given the expected difficulty of creating yieldable CA structures, the issue of modeling CA variability is absolutely critical for CMOS circuit designers.

SUMMARY OF THE INVENTION

The present invention is directed to a methodology and algorithm to obtain a dramatically improved prediction of CA resistance in electronic circuits; particularly, an improved CA resistance model adapted to capture larger than anticipated "out of spec" regime.

In one embodiment, a whole set of software tools to develop this algorithm, which includes a novel bucketization scheme, is implemented. This provides the circuit designer with considerably better design options for handling large CA variability as seen through the design manual.

The tools developed for modeling impact of CA variable resistance phenomena according to the present invention provide developers with a resistance model, such as conventionally known, modified with a new CA model Basis, a novel CA Intrinsic Resistance Model, and, a novel CA Layout Bucketization Model.

Thus, advantageously, the CA Resistance Model of the present invention addresses CA size concerns in 45 nm and 32 nm designs to capture larger than anticipated "out of spec" regime, to provide better margin in more controlled regimes and, to separate out random and systematic effects. Further, the novel model and algorithm addresses CA resistance variation concerns from combined variations of litho, stud CA dimension, and intrinsic materials which are all layout-based size effects.

In accordance with a first aspect of the invention, there is provided a method for modeling the resistance of a semiconductor contact via (CA) structure sensitive to layout-based and fabrication based variations, the method comprising the steps of:

obtaining layout contours of the contact via structure and semiconductor structures contacting the contact via structure accounting for various sets of lithographic processing condition parameters;

determining from the layout contours an intersecting area of said contact via structure with said contacting semiconductor structures, the intersecting areas obtained for said various sets of lithographic processing condition parameters and stud dimensions;

obtaining one or more CA resistance distributions with each distribution having layout-based variations, lithographic processing condition parameter variations, stud dimension variations, and material fill property and thickness variations; and, bucketizing CA resistance distributions; and, providing a device parasitic netlist with bucketized CA resistance values; and, utilizing the device parasitic netlist values to provide for more accurate circuit behavior modeling of circuits having the CA.

Further to this aspect, the obtained intersecting areas account for a complete set of process window conditions.

Particularly, the lithographic processing condition parameters comprise one or more of layout, focus, dose, mask error, overlay in x-direction, overlay in y-direction, etch bias, height and taper. The method further comprises determining an intrinsic resistance of the CA structure, the one or more CA resistance distributions obtained being further a function of layout, material properties, height, taper and etch bias of the CA structure.

Further to this aspect of the invention, a CA contacting semiconductor structure comprises an active semiconductor device area upon which the CA is overlayed, the intersecting area representing a difference between a projected overlay of the CA on the active semiconductor device area and the actual CA overlay on the active semiconductor device area. The bucketizing of the CA resistance distributions is based on both image quality and quality of overlay represented by the intersecting area of the CA structure and the active semiconductor device area, the bucketizing comprising:

defining good and bad image quality and good and bad overlay effects for a the CA structure; and, grouping CA resistance distributions according to combinations of the good and bad image quality and good and bad overlay effects, in various combinations.

Furthermore, the grouping of CA resistance distributions comprises: a first CA bucket representing a good overlay effect and good image quality; a second CA bucket representing a bad overlay effect and good image quality; a third CA bucket representing a good overlay effect and bad image quality; and, a fourth CA bucket representing a bad overlay effect and bad image quality.

The bucketizing of CA resistance distributions further includes a nominal resistance value for each bucket and an n-sigma maximum resistance value for storage in the device parasitic netlist associated with a grouped CA resistance distribution.

In accordance with a further aspect of the invention, there is provided a method for optimizing modeling of semiconductor circuit performance comprising:

a) obtaining optical proximity corrected (OPC) contours of a plurality of layout varying contact via (CA) structures in a semiconductor circuit;

b) determining from the layout contours, for each the plurality of CA, an intersecting area of each the CA structure with the contacting semiconductor structures, the intersecting areas obtained for a set of lithographic processing condition parameters;

c) determining, for each the plurality of CA, an image quality state and overlay effects state for each the CA structure; and, d) repeating steps a) through c) for multiple fabrication runs for each identified CA, with each of the multiple runs having new layout-based and lithographic processing condition parameter variations from a prior run; and, e) determining CA resistance values based on the layout-based and lithographic processing condition parameter variations and generating CA resistance distributions according to the layout-based and lithographic processing condition parameter variations; and, f) codifying the CA resistance distributions as buckets for use in modeling circuit performance, wherein the resistance distribution includes CA resistance values accurately reflecting acceptable image quality and overlay effects.

BRIEF DESCRIPTION OF THE DRAWINGS

The objects, features and advantages of the present invention will become apparent to one skilled in the art, in view of the following detailed description taken in combination with the attached drawings, in which.

DETAILED DESCRIPTION OF THE PREFERRED EMBODIMENTS

The present invention is directed to a methodology and algorithm to obtain a dramatically improved prediction of CA (Contact Via) resistance in electronic circuits; particularly, an improved CA resistance model adapted to capture larger than anticipated "out of spec" regime.

The novel algorithm and methodology implemented for improving CA resistance variability provides model results that can be codified and released through a Design Manual. In one aspect of the invention, a novel CA bucketization model is implemented, that, as will be described in greater detail herein, provide model results in the form of CA buckets and the respective resistance means/sigmas. In order to facilitate development of devices at the 45 nm and 32 nm technology level, these model results have to be added to the model/extraction suite and design kits and consequently, therefore have to facilitate extraction vendor tool developers (for tools such as Calibre, Assura, Hercules, etc.).

In one embodiment, a whole set of software tools to develop this algorithm, which includes a novel bucketization scheme, is implemented. This provides the circuit designer with considerably better design options for handling large CA variability as seen through the design manual. The tools developed for modeling impact of CA resistance variability according to the present invention, provide developers with a better CA Resistance Model, such as conventionally known, modified with a new CA model Basis, a novel CA Intrinsic Resistance Model, and, a novel CA Layout Bucketization Model.

Thus, the CA Resistance Model of the present invention addresses CA size concerns in 45 nm and 32 nm designs to capture larger than anticipated "out of spec" regime, to provide better margin in more controlled regimes and, to separate out random and systematic effects. Further, the novel model and algorithm addresses CA resistance variation concerns from combined intrinsic CA resistance and layout-based size effects.

Figure 3:
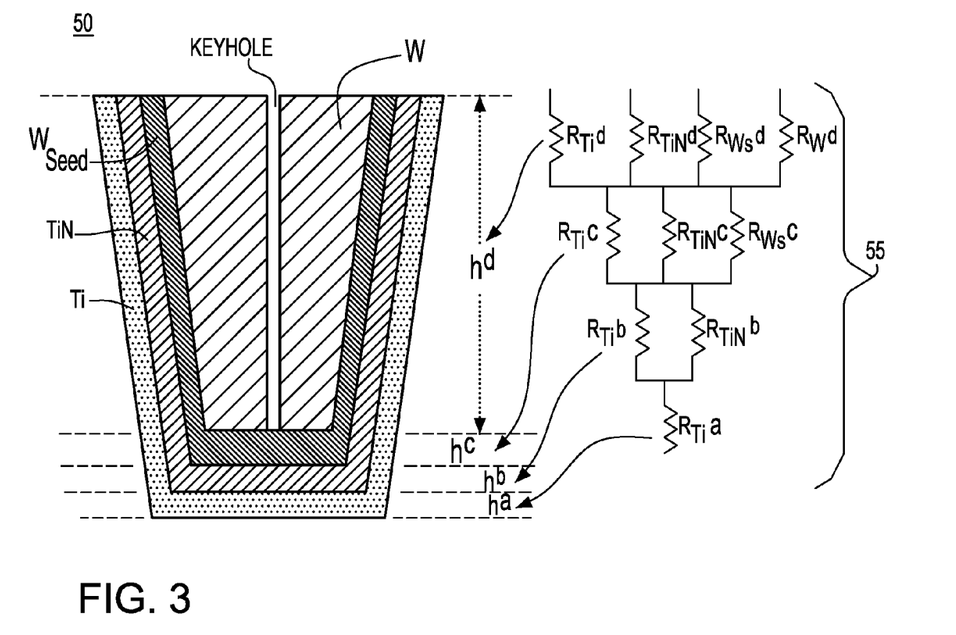
FIG. 3 depicts a CA Intrinsic Resistance Model for a tapered CA structure 50 according to one aspect of the invention.

With respect to the new CA model basis, a novel CA Intrinsic Resistance Model is implemented for a tapered CA structure 50 shown in the FIG. 3. That is, in the Intrinsic Resistance Model, the resistance is a function of the CA CD, wherein the top CD is more fundamental in lithography as the bottom CD is basic to integration. The Bottom and top models are linked through taper/height. The CA Intrinsic Resistance Model as implemented according to the present invention corrects for the inconsistencies present in the prior art models by properly accounting for top-bottom-height-taper correlation. Additionally, variations in thickness and material properties are added to the model. Furthermore, some material properties are treated as function of CA size and data may be obtained to calibrate these properties.

In one embodiment, the CA Intrinsic Resistance Model implemented includes multi-materials, properties, thicknesses, the keyhole diameter, interface resistance, taper, height, etc., of the modeled CA structure 50 as depicted in FIG. 3. Thus, for example, as shown in FIG. 3, the CA Intrinsic Resistance Model will account for the resistive properties of the Titanium, TiN, Tungsten (seed) layers Tungsten (W) material fill, and Ti-silicide interface resistance within the tapered CA. As shown in FIG. 3, the CA intrinsic resistance is modeled by breaking up the CA material into series & parallel resistance combinations.

Figure 4:
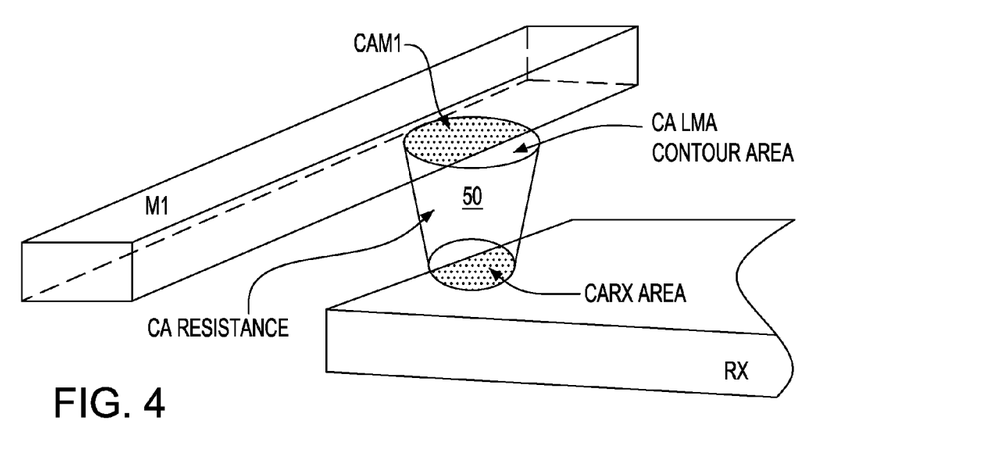
FIG. 4 is a diagram depicting layout/process-based CA area sensitivities for a tapered CA structure, such as the CA structure 50 shown in the FIG. 3.

With respect to the new CA model basis, a novel CA Layout Bucketization Model is implemented according to a further aspect of the invention. As shown in FIG. 4, there is depicted the layout/process-based CA area sensitivities for a tapered CA structure, such as the CA structure 50 shown in the FIG. 3. That is, a first effect includes a CAM1 effect which is a contribution of the effect of metal 1 (M1) layer wrap-around over the CA's top CD area; a second effect is the CA contour area which is a function of layout, focus, dose, meff, overlay tolerance, and etch bias; a third effect is the CA resistance which is a function of the material properties, the height, taper degree, and the CARX area, which is a function of layout, focus, dose, meff, overlay tolerance, and etch bias in both the CA and RX, and of the height and taper of the CA stud.

Figure 5:
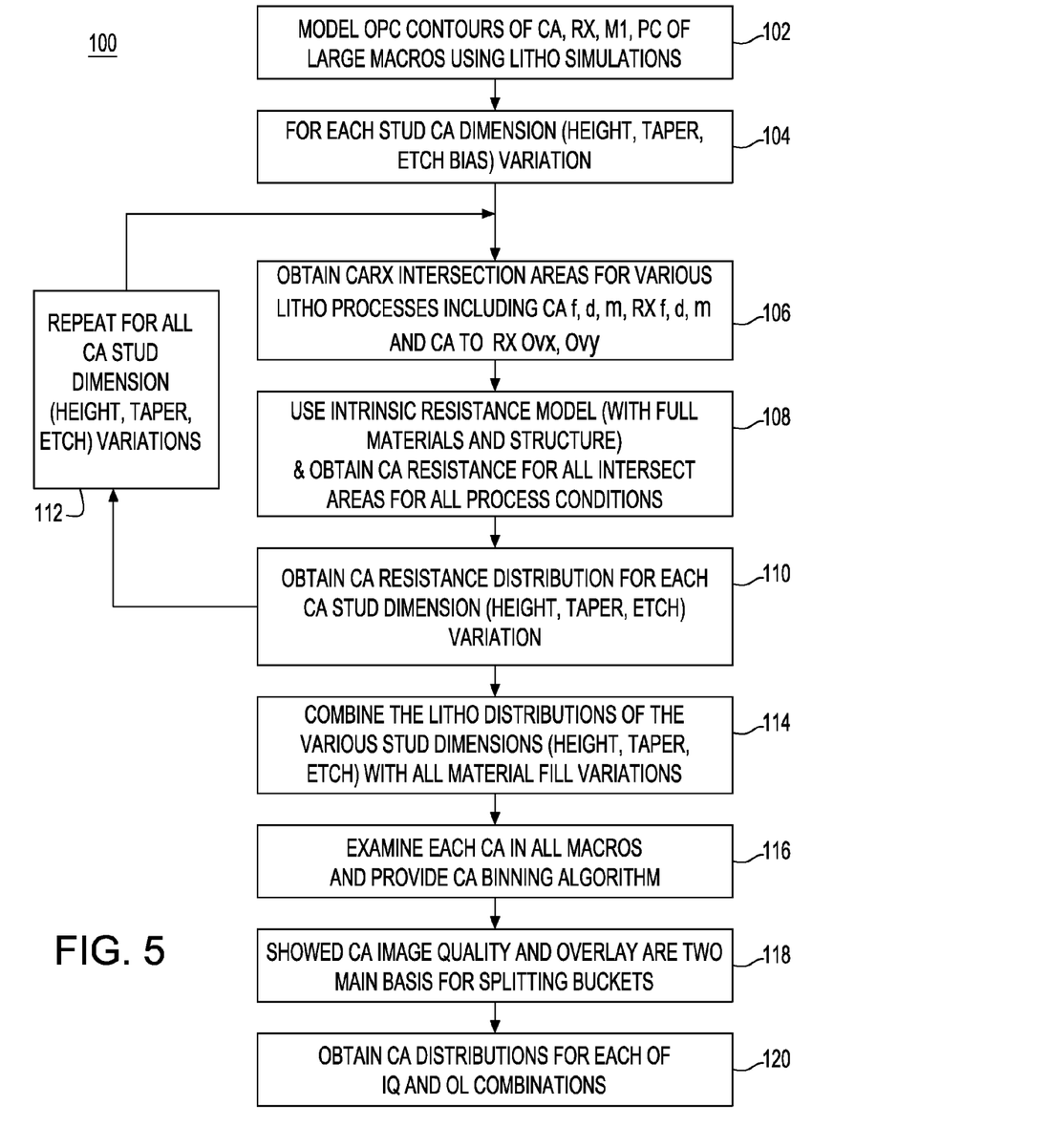
FIG. 5 depicts a Layout-based CA bucketization Model flow 100 according to one embodiment of the present invention.

FIG. 5 depicts a Layout-based CA bucketization Model flow 100 according to one embodiment of the present invention.

As shown at a first step 102, the model implements a tool for obtaining OPC (optical proximity corrected) contours of the CA, RX, M1 and PC features for a large number of macros or layouts with highly varying CA structures. A contour is a modeled expectation of what a shape looks on wafer which has been calibrated with SEM pictures. In one embodiment, such a tool comprises a Lithography simulations tool (known in prior art, for example, the Lithography Manufacturability Assessor, LMA, Liebmann, et al. "Reducing DFM to practice: the lithographic manufacturability assessor", Proc SPIE V6156, pp. 178-189, 2006) to obtain the contours for various focus, dose, mask, error litho process conditions for various mask levels. The primary ones of interest in the present invention are CA and RX contours. The lithographic contours are obtained using litho models and OPC for a combination of litho parameters (focus, dose, meff, etc.) and all contours are saved and stored in standard gl1/oasis/gds format for a variety of large macros.

The next step 104 defines the choice of CA stud dimensions (such as height, taper, and etch bias for nominal and 3 sigma variants) for which the full litho matrix simulations on the macros are run.

The next step 106 depicts, for every CA, the calculation of a CA-RX intersect area for the complete set of litho process window conditions. That is, using the obtained lithographic contours (e.g., in gl1/oasis/gds or other like format), this step requires obtaining the CARX intersection areas for CAs in the entire layout and storing all the relevant information in tables. Using known extraction tool (Calibre/Erie/Hercules) functions for the overlay analysis, shift relative contours and intersections areas are determined. For each height, taper, and etch bias there is obtained the tapered down area of the CA. One way to do this is to take the CA litho contour at the top and scale the area to represent the taper down for the given CA stud height. For overlay effects the CA and RX contours are shifted relative to each other for the respective overlay condition and then the CARX intersect area is calculated using prior art methods. This includes process parameters (focus, dose, meff) for both the CA and RX and stud dimensions (CA height, taper, etch) etc. Each individual combination of process, structural, or material variables are stored in a table of CA intersect areas.

Continuing, at step 108, using the CA distributions obtained from the previous step 106, and using the Intrinsic Resistance Model (from full materials and structure) there is further obtained the step of obtaining a CA Resistance. More particularly, an "IntRes" code is developed to calculate the CA resistances for various areal CA-RX intersect areas stored in the table. The IntRes model and code are based on improvements to previous models with additional features such as fill and material sensitivities to area itself. The areas are input from combinations of litho, height, taper, and etch runsets for various process variant combinations.

At step 110 the distributions of the various CA resistances are obtained for each of the CA stud dimension (height, taper, and etch) combinations.

Step 112 repeats steps 106 through 110 for each of the combinations of stud dimensions.

Step 114 analyzes these litho and stud dimension distributions for material property variants and combines the statistics of all the litho, material, and stud dimension variants into full distributions of CA resistances for each of the CAs in the various macros structures. The material property variations include thicknesses and resistances of the various material layers that are used to fill the CA stud (Titanium layer, TiN layer, tungsten seed layer, tungsten fill, key-hole, and Titanium-nickel silicide interface resistance).

In step 116 based on the nominals and tails of the various CAs in these macros the CAs are binned. One example is isolated versus nested CAs where all isolated CAs fall within one set of nominal and tail resistance values while the nested CAs have a different nominal and tail CA resistance. Therefore, depending on the neighboring features CAs behave differently and they belong to different buckets. Thus, based on layout related CA resistance systematics, the CA bucketization algorithm is implemented.

In order to keep the number of buckets small, at step 118 the buckets model are sub-divided into two types (overlay (OL) and image quality (IQ)). Every CA has: (a) either a good or bad OL and (b) a good or bad IQ. However, it is understood that multiple levels of overlay and image quality can be implemented and used in various combinations to increase the granularity of the buckets that may be modeled.

In step 120 the CA distributions are determined for each combination of OL and IQ combinations. The distributions are based on the Monte Carlo analysis or RSS (Root Sum Squared) of various combinations with each new distribution having a "layout/systematic" component. Each CA will fall into one of these buckets based on "layout".

Figure 6:
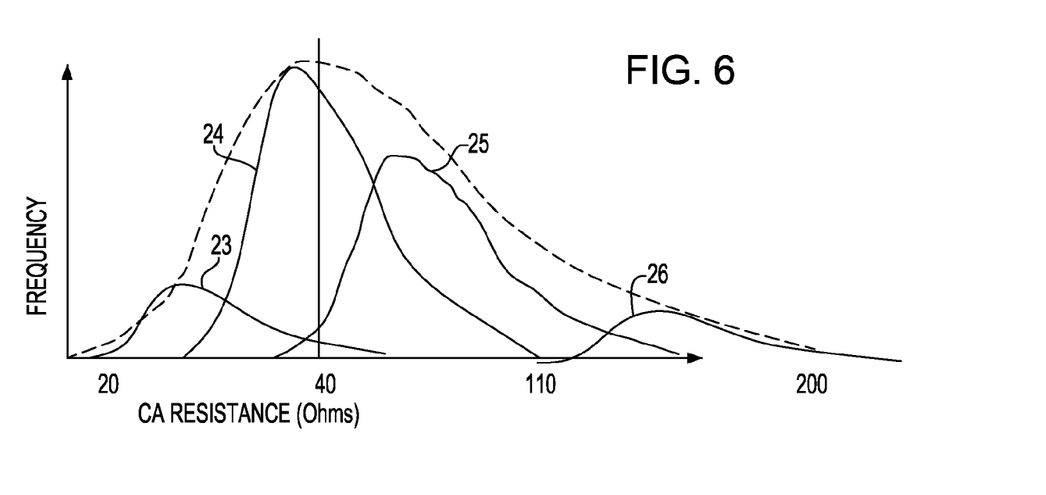
FIG. 6 depicts an example multi-bucket distribution model and particularly showing bucket distributions with which to represent the CA resistance using the CA bucketization techniques of the present invention.

Thus, rather than the single distribution as shown in FIGS. 1A, 1B, there may be a plurality of buckets such as the multi-bucket distribution model of FIG. 6 which shows bucket distributions 23-26 with which to represent the CA resistance using the CA bucketization techniques of the present invention. All the buckets for the identified CAs that are sensitive to resistance variability are input into the design manual.

Figure 7A:
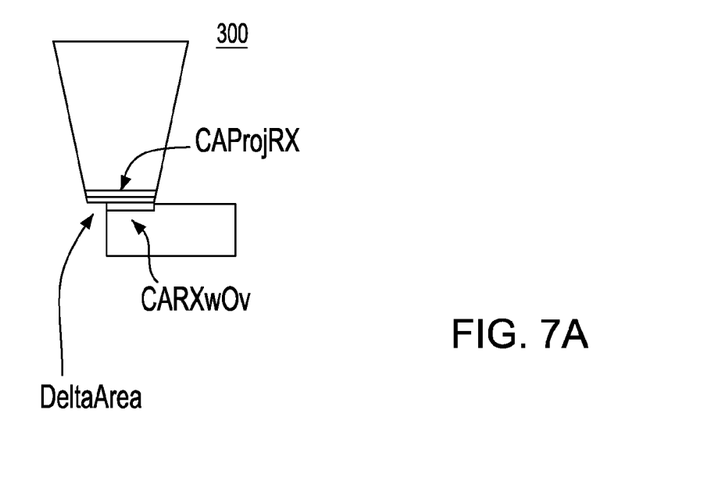
FIG. 7A depicts conceptually a possible overlay effect 300 for an example CA found in an example circuit structure (not shown); and, FIG. 7B depicts the overlay effects for each of the multiple CAs found in an example contour tools result (not shown)
Figure 7B:
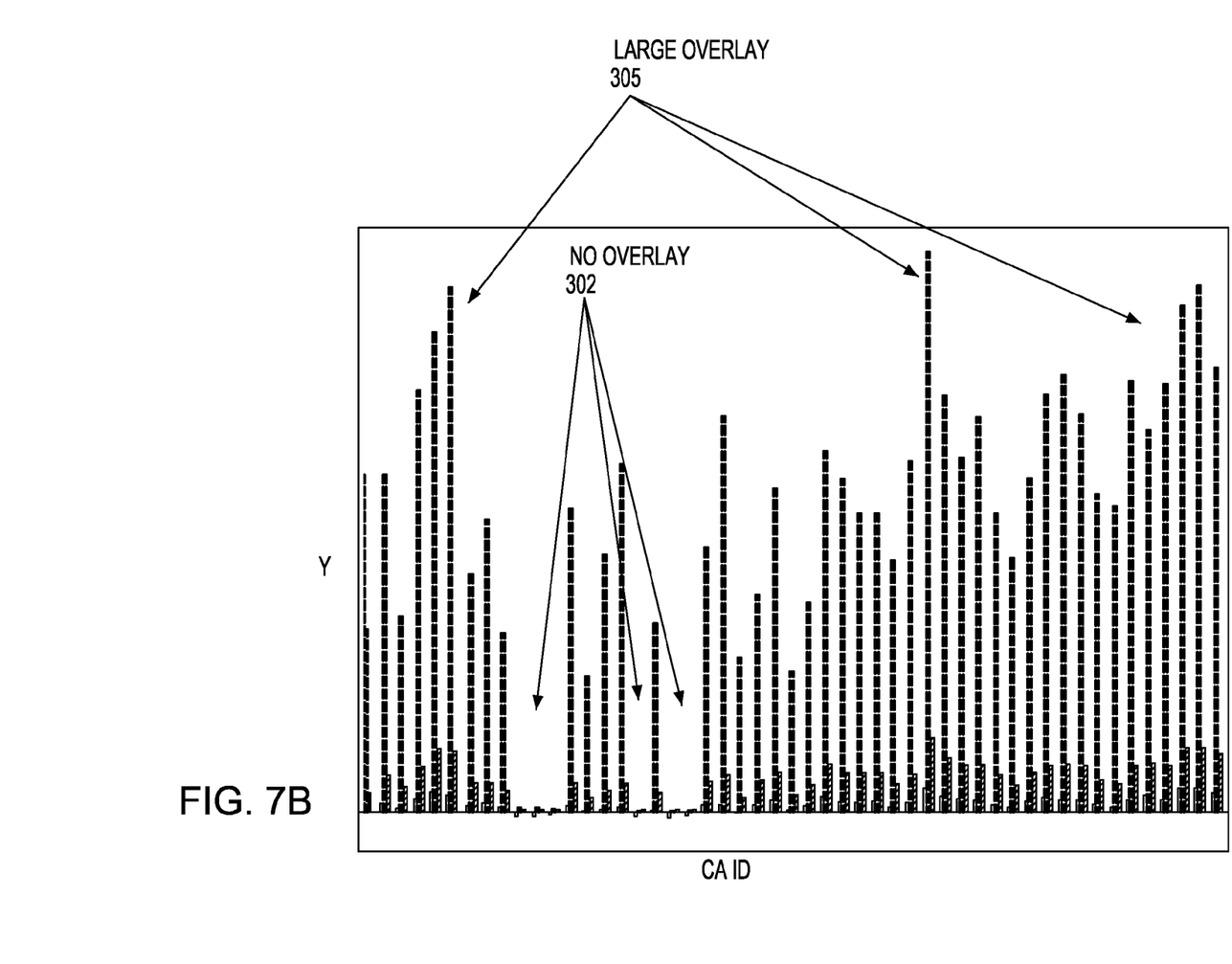

To insure that the overlay effects are properly accounted for each CA in the model, it is necessary to ensure overlay binning is accurate. Overlay is measured through the DeltaArea as seen in FIG. 7 which is equal to a difference between the CAProjRX−CARXwOv values. Small DeltaArea would show little or no overlay effect, i.e., a "Good" Ov bucket, while a large DeltaArea would show loss of area through overlay, i.e., a "Bad" Ov bucket.

Figure 8:
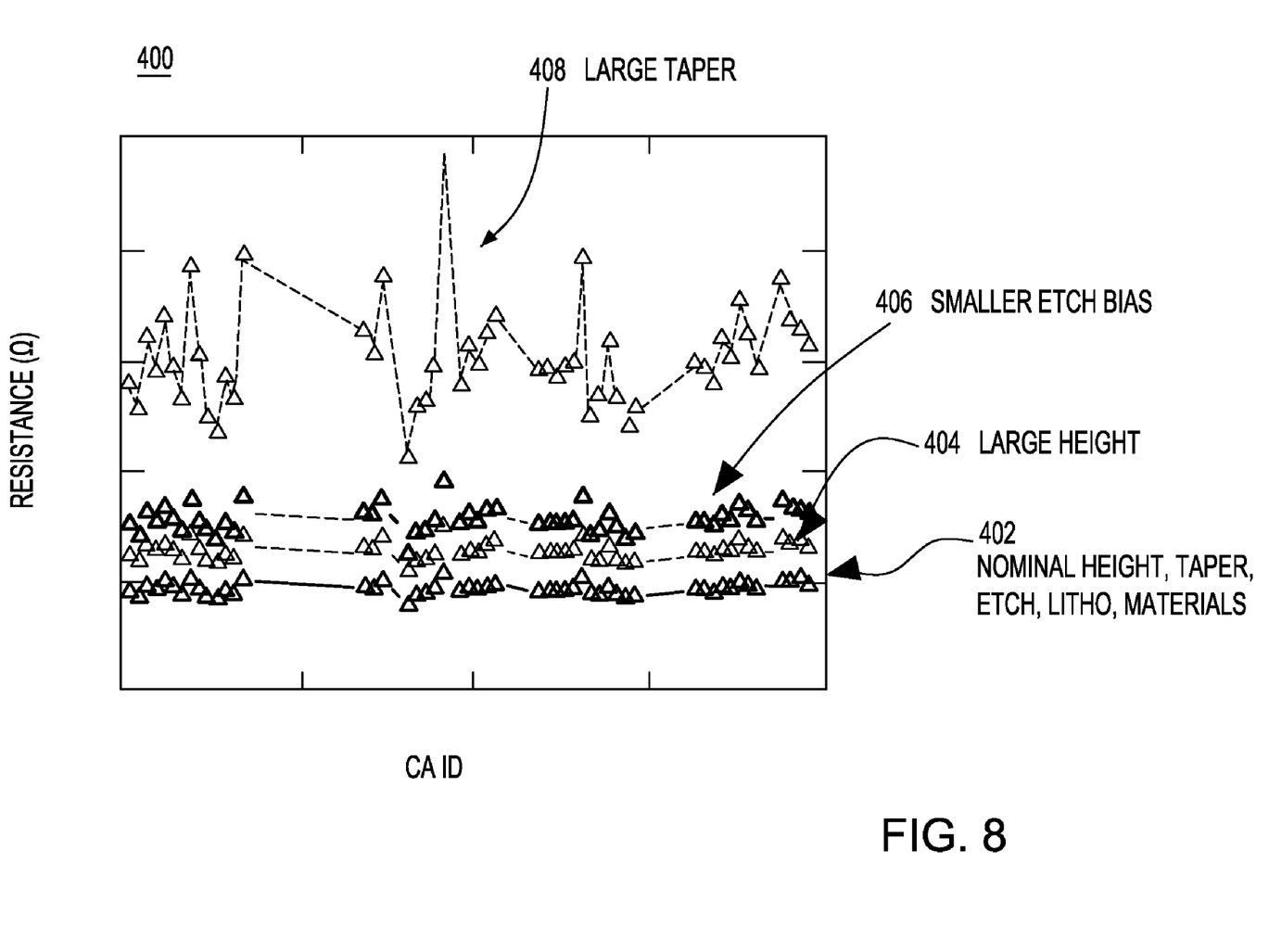
FIG. 8 is a plot 400 depicting conceptually the CARX resistance impact as a function of height, taper, and etch variations for each of the multiple CAs found in an example circuit (not shown)

Further, the bucketization model analysis accounts for the effects of CARX as a function of h, T, e (height, taper and etch bias) variations. FIG. 8 is a plot 400 depicting conceptually the resistance impact as a function of h, T, e variations for each of the CAs found in an example circuit. The CAID is the identity of every CA in the structure. The nominal case for all litho parameters, stud dimensions, and materials is shown as line 402 in FIG. 8. As shown in FIG. 8, line 404 shows the effect of increasing stud height, while line 406 shows the impact of smaller etch bias, and line 408 shows the impact of increased taper. As can be seen the impact of taper is dramatic.

For a full distributions analysis, i.e., for each chosen bucket, the CAs are grouped and an analysis performed to obtain "nominal" and "sigma" values for each of these buckets. Multiple runs as seen in FIG. 5 with parametric variations are examined and interdependencies accounted for. A further statistical analysis is then performed to examine 3-sigma deviations of every parameter using an interdependency tree.

Monte Carlo analysis information with litho variants of CA for f,d,m, RX for f,d,m, and CA-RX Ox, Oy for h, T, e nominal and tail parameters, are piped into tables and stored. Then, for various material properties Internal Resistance calculations may be externally assessed with correlated h, T, e values.

The performance of the steps 100 shown in FIG. 5, advantageously provides the modeling development tools with the ability to implement the CA bucketization techniques of the present invention. The model additionally includes the resistance calculations for means and sigmas using areal measures from litho tools (LMA), intersect area calculators, and intrinsic resistance calculation combinations. As shown in FIG. 6, four CA buckets 23-26 are proposed for implementation in the design manual. To bucketize the CA, IQ (Image Quality) and an OL algorithm are implemented.

The four buckets labeled Bucket1-Bucket4 correspond to the following:

|  | IQ | OL |
|---|---|---|
| Bucket1 | G | G |
| Bucket2 | G | B |
| Bucket3 | B | G |
| Bucket4 | B | B |

Where B is "bad" (IQ or overlay) and G is "Good" (IQ or overlay).

An extraction tool [ERIE, Calibre, etc.] will use CA tags (already keeping track of CARX vs CAPC) and each bucketized CA resistance is to have its own nominal and sigma values (see modeled numbers). The extraction tool further stores "correct" CA-averaged resistance in device parasitic netlist.

Figure 9A:
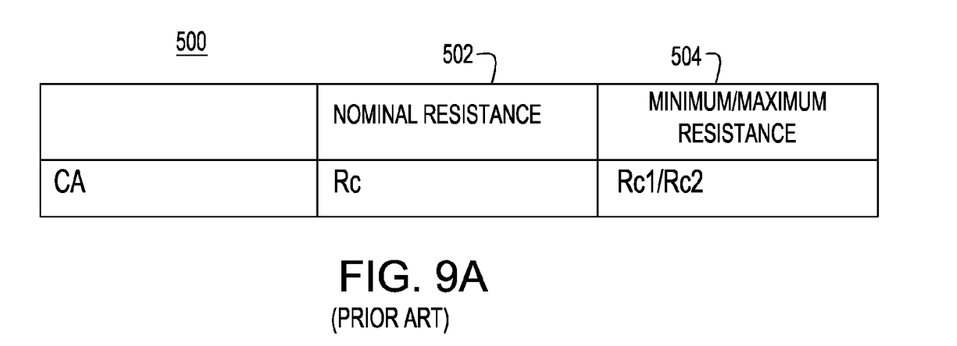
FIG. 9A is a table depicting only the 3 CA resistance values 500 stored in the prior art design manual for conventional without implementing the bucketization technique; and, FIG. 9B is a table depicting the new CA resistance values 550 stored in the design manual for utilizing the bucketization technique of the invention.

FIG. 9A is a table depicting the old CA resistance values 500 stored in the prior art design manual without the bucketization technique. As shown, a single nominal resistance value 502 for the CA contacts (levels), i.e., the M1-CA-RX and M1-CA-PC levels, and single maximum/minimum resistance values 504 for the CA are provided in the design manual.

Figure 9B:
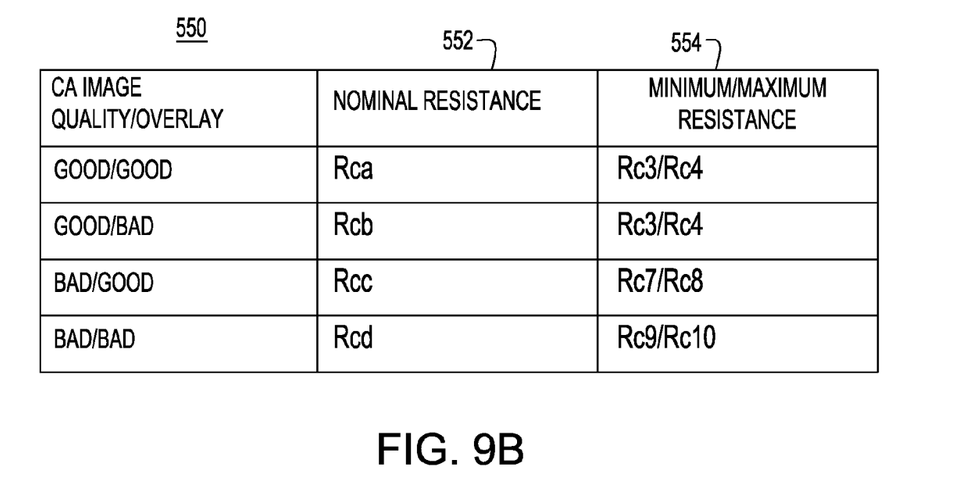

FIG. 9B is a table depicting the new CA resistance values 550 stored in the design manual utilizing the bucketization technique of the invention. As a result of the invention, new CA-RX design manual values are provided for each of the CARXx, x=1, 2, 3 and 4 buckets, as shown in FIG. 9B. That is, each CARXx level is provided with a corresponding new nominal resistance value 552 in addition to new maximum/minimum resistance values 554. These CA buckets will replace the single values included in the design manual according to the invention leading to more accurate circuit modeling.

The system and method of the present disclosure may be implemented and run on a general-purpose computer or computer system. The computer system may be any type of known or will be known systems and may typically include a processor, memory device, a storage device, input/output devices, internal buses, and/or a communications interface for communicating with other computer systems in conjunction with communication hardware and software, etc.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

What is claimed is:

1. A method for modeling the resistance of a semiconductor contact via (CA) structure sensitive to layout-based and fabrication based variations, said method comprising the steps of:
   using a computer, obtaining layout contours of said contact via structure and semiconductor structures contacting said contact via structure accounting for various sets of lithographic processing condition parameters;
   determining from said layout contours an intersecting area of said contact via structure with said contacting semiconductor structures, said intersecting areas obtained for said various sets of lithographic processing condition parameters and stud dimensions;
   obtaining one or more CA resistance distributions with each distribution having layout-based variations, lithographic processing condition parameter variations, stud dimension variations, and material fill property and thickness variations; and,
   bucketizing CA resistance distributions; and,
   providing a device parasitic netlist with bucketized CA resistance values; and,
   utilizing said device parasitic netlist values to provide for more accurate circuit behavior modeling of circuits having said CA.

2. The method as claimed in claim 1, wherein said obtained intersecting areas account for a complete set of process window conditions and stud dimensions.

3. The method as claimed in claim 2, wherein said lithographic processing condition parameters comprise one or more of layout, focus, dose, mask error, overlay in x-direction, overlay in y-direction, and stud dimensions of height, taper, and etch bias.

4. The method as claimed in claim 1, further comprising: determining an intrinsic resistance of said CA structure, said one or more CA resistance distributions obtained being further based on a determined intrinsic resistance value for said CA structure.

5. The method as claimed in claim 4, wherein said intrinsic resistance of said CA structure is a function of layout, material properties, height, taper, and etch bias of said CA structure.

6. The method as claimed in claim 1, wherein a CA contacting semiconductor structure comprises an active semiconductor device area upon which said CA is overlayed, said intersecting area representing a difference between a projected overlay of said CA on said active semiconductor device area and said actual CA overlay on said active semiconductor device area.

7. The method as claimed in claim 6, wherein said bucketizing CA resistance distributions is based on both image quality and quality of overlay represented by said intersecting area of said CA structure and said active semiconductor device area, said bucketizing comprising:
   defining good and bad image quality and good and bad overlay effects for a said CA structure; and,
   grouping CA resistance distributions according to combinations of said good and bad image quality and good and bad overlay effects, in various combinations.

8. The method as claimed in claim 7, wherein said grouping of CA resistance distributions comprises: a first CA bucket representing a good overlay effect and good image quality; a second CA bucket representing a bad overlay effect and good image quality; a third CA bucket representing a good overlay effect and bad image quality; and, a fourth CA bucket representing a bad overlay effect and bad image quality.

9. The method as claimed in claim 1, wherein said bucketizing CA resistance distributions includes a nominal resistance value for each bucket and an n-sigma maximum resistance value for storage in said device parasitic netlist associated with a grouped CA resistance distribution.

10. A method for optimizing modeling of semiconductor circuit performance comprising:
   a) using a computer, obtaining optical proximity corrected (OPC) contours of a plurality of layout varying contact via (CA) structures in a semiconductor circuit;
   b) determining from said layout contours, for each said plurality of CA, an intersecting area of each said CA structure with said contacting semiconductor structures, said intersecting areas obtained for a set of lithographic processing condition parameters;
   c) determining, for each said plurality of CA, an image quality state and overlay effects state for each said CA structure; and,
   d) repeating steps a) through c) for multiple fabrication runs for each identified CA, with each of said multiple runs having new layout-based and lithographic processing condition parameter variations from a prior run; and,
   e) determining CA resistance values based on said layout-based variations, lithographic processing condition parameter variations, stud dimension variations, and material property and thickness variations, and generating CA resistance distributions according to said layout-based variations, lithographic processing condition parameter variations, stud dimension variations, and material property and thickness variations; and
   f) codifying said CA resistance distributions as buckets for use in modeling circuit performance;
   wherein said resistance distribution includes CA resistance values accurately reflecting acceptable image quality and overlay effects.

11. The method as claimed in claim 10, wherein said lithographic processing condition parameters comprise one or more of layout, focus, dose, mask error, overlay in x-direction, overlay in y-direction, and stud dimension of height, taper, and etch bias.

12. The method as claimed in claim 10, further comprising: determining an intrinsic resistance of said CA structures, said one or more CA resistance distributions obtained being further based on a determined intrinsic resistance value for said CA structure.

13. The method as claimed in claim 12, wherein said intrinsic resistance of a CA structure is a function of layout, material properties, height, taper, and etch bias of said CA structure.

14. The method as claimed in claim 10, wherein a CA contacting semiconductor structure comprises an active semiconductor device area upon which said CA is overlayed, said intersecting area representing a difference between a projected overlay of said CA on said active semiconductor device area and said actual CA overlay on said active semiconductor device area.

15. The method as claimed in claim 14, wherein CA resistance distributions includes CA resistance values based on both image quality and quality of overlay represented by said intersecting area of said CA structure and said active semiconductor device area, said generating CA resistance distributions comprising:
   defining good and bad image quality and good and bad overlay effects for a said CA structure; and,
   grouping CA resistance distributions according to combinations of said good and bad image quality and good and bad overlay effects, in various combinations.

16. The method as claimed in claim 15, wherein said grouping of CA resistance distributions comprises: a first CA bucket representing a good overlay effect and good image quality; a second CA bucket representing a bad overlay effect and good image quality; a third CA bucket representing a good overlay effect and bad image quality; and, a fourth CA bucket representing a bad overlay effect and bad image quality.

17. The method as claimed in claim 10, wherein said codifying bucketizing CA resistance distributions includes a nominal resistance value for each bucket and an n-sigma maximum resistance value for storage in said device parasitic netlist associated with a grouped CA resistance distribution.

18. A program storage device readable by a machine, tangibly embodying a program of instructions executable by the machine to perform method steps for modeling the resistance of a semiconductor contact via (CA) structure sensitive to layout-based and fabrication based variations, said method steps including the steps of:

obtaining layout contours of said contact via structure and semiconductor structures contacting said contact via structure accounting for various sets of lithographic processing condition parameters;

determining from said layout contours an intersecting area of said contact via structure with said contacting semiconductor structures, said intersecting areas obtained for said various sets of lithographic processing condition parameters and stud dimensions;

obtaining one or more CA resistance distributions with each distribution having layout-based variations, lithographic processing condition parameter variations, stud dimension variations, and material fill property and thickness variations; and     bucketizing CA resistance distributions; and     providing a device parasitic netlist with bucketized CA resistance values; and     utilizing said device parasitic netlist values to provide for more accurate circuit behavior modeling of circuits having said CA.

\* \* \* \* \*